(12) United States Patent
Anderl et al.

(10) Patent No.: US 9,482,349 B2
(45) Date of Patent: Nov. 1, 2016

(54) AIR VALVE FOR ELECTRONICS ENCLOSURES

(71) Applicant: International Business Machines Corporation, Armonk, NY (US)

(72) Inventors: William J. Anderl, Rochester, MN (US); Bret P. Elison, Rochester, MN (US); Phillip V. Mann, Rochester, MN (US); Arden L. Moore, Cedar Park, TX (US); Arvind K. Sinha, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 494 days.

(21) Appl. No.: 14/151,097

(22) Filed: Jan. 9, 2014

(65) Prior Publication Data

US 2015/0192219 A1    Jul. 9, 2015

(51) Int. Cl.
| | |
|---|---|
| H05K 5/00 | (2006.01) |
| F16K 3/10 | (2006.01) |
| F16K 31/08 | (2006.01) |
| F16K 3/02 | (2006.01) |
| F16K 3/03 | (2006.01) |
| G06F 1/20 | (2006.01) |
| H05K 7/20 | (2006.01) |

(52) U.S. Cl.
CPC ............... *F16K 3/10* (2013.01); *F16K 3/0245* (2013.01); *F16K 3/03* (2013.01); *F16K 31/086* (2013.01); *G06F 1/20* (2013.01); *H05K 7/20181* (2013.01); *H05K 7/20727* (2013.01)

(58) Field of Classification Search
CPC ............... H05K 7/20181; H05K 7/20727; F16K 3/10; F16K 3/0245; F16K 31/086
USPC ........................................... 454/184
See application file for complete search history.

(56) References Cited

U.S. PATENT DOCUMENTS

| | | | | |
|---|---|---|---|---|
| 2,981,172 A | * | 4/1961 | Kalman | ............... F04D 25/14 454/352 |
| 3,212,425 A | * | 10/1965 | Hazen | ............... F24F 7/025 454/352 |

(Continued)

FOREIGN PATENT DOCUMENTS

GB        2295669 A    6/1996

OTHER PUBLICATIONS

Anderl et al., "Air Valve for Electronics Enclosures", U.S. Appl. No. 14/870,248, filed Sep. 30, 2015.

(Continued)

*Primary Examiner* — Helena Kosanovic
(74) *Attorney, Agent, or Firm* — Richard A. Wilhelm; Robert Wiliams

(57) ABSTRACT

An air valve includes a frame and a sheet of thin material. The frame may have an outlet-side member configured mounted on a fan housing and an inlet-side member rotatably coupled to the outlet-side member. The material may have top and bottom edges, and a plurality of folds perpendicular to the top and bottom side edges that divide the sheet into a plurality of sections. The material may be attached to the outlet-side member and the inlet-side member, and configurable between folded and expanded positions. An attraction between a magnetic component on the inlet-side member and a magnetic component on a rotating fan blade may cause the inlet-side member to rotate, moving the material into the folded configuration. When the fan blade is not rotating, a spring attached at a pivot point may cause the inlet-side member to rotate in an opposite direction, moving the material into the expanded position.

10 Claims, 9 Drawing Sheets

(56) References Cited

U.S. PATENT DOCUMENTS

| | | | |
|---|---|---|---|
| 6,011,689 | A | 1/2000 | Wrycraft |
| 6,401,474 | B1* | 6/2002 | Wigglesworth ........ F04D 25/14 62/259.1 |
| 7,184,268 | B2 | 2/2007 | Espinoza-Ibarra et al. |
| 7,907,403 | B2 | 3/2011 | Malone et al. |
| 8,066,559 | B2 | 11/2011 | Cochrane |
| 8,388,423 | B2 | 3/2013 | Cruz et al. |
| 8,482,917 | B2 | 7/2013 | Rose et al. |
| 2007/0207723 | A1 | 9/2007 | Baker et al. |
| 2012/0149293 | A1* | 6/2012 | Labrecque .............. F24F 13/14 454/353 |

OTHER PUBLICATIONS

Anonymous, "Method for an air duct with circulation prevention", IP.com Prior Art Database Technical Disclosure, IP.com No. IPCOM000143934D, Published Dec. 12, 2006. http://ip.com/IPCOM/000143934.

Anonymous, "Retractable Blockage for Use in Failed Air Moving Devices to Prevent Recirculation", IP.com Prior Art Database Technical Disclosure, IP.com No. IPCOM000208993D, Published Jul. 22, 2011. http://ip.com/IPCOM/000208993.

IBM, "Fan Airflow Recirculation Controller", IP.com Prior Art Database Technical Disclosure, IP.com No. IPCOM000113322D, Electronic Publication Mar. 27, 2005, (Original Publication Aug. 1, 1994, IBM Technical Disclosure Bulletin, vol. 37, No. 8). http://ip.com/IPCOM/000113322.

IBM, "Plastic Film Fan Valve for Backflow Prevention in Multi-Fan Plenum Cooling Systems", IP.com Prior Art Databse Technical Disclosure, IP.com No. IPCOM000115844D, Electronic Publication Mar. 30, 2005, (Original Publication Jun. 1, 1995, IBM Technical Disclosure Bulletin, vol. 38, No. 6). http://ip.com/IPCOM/000115844.

\* cited by examiner

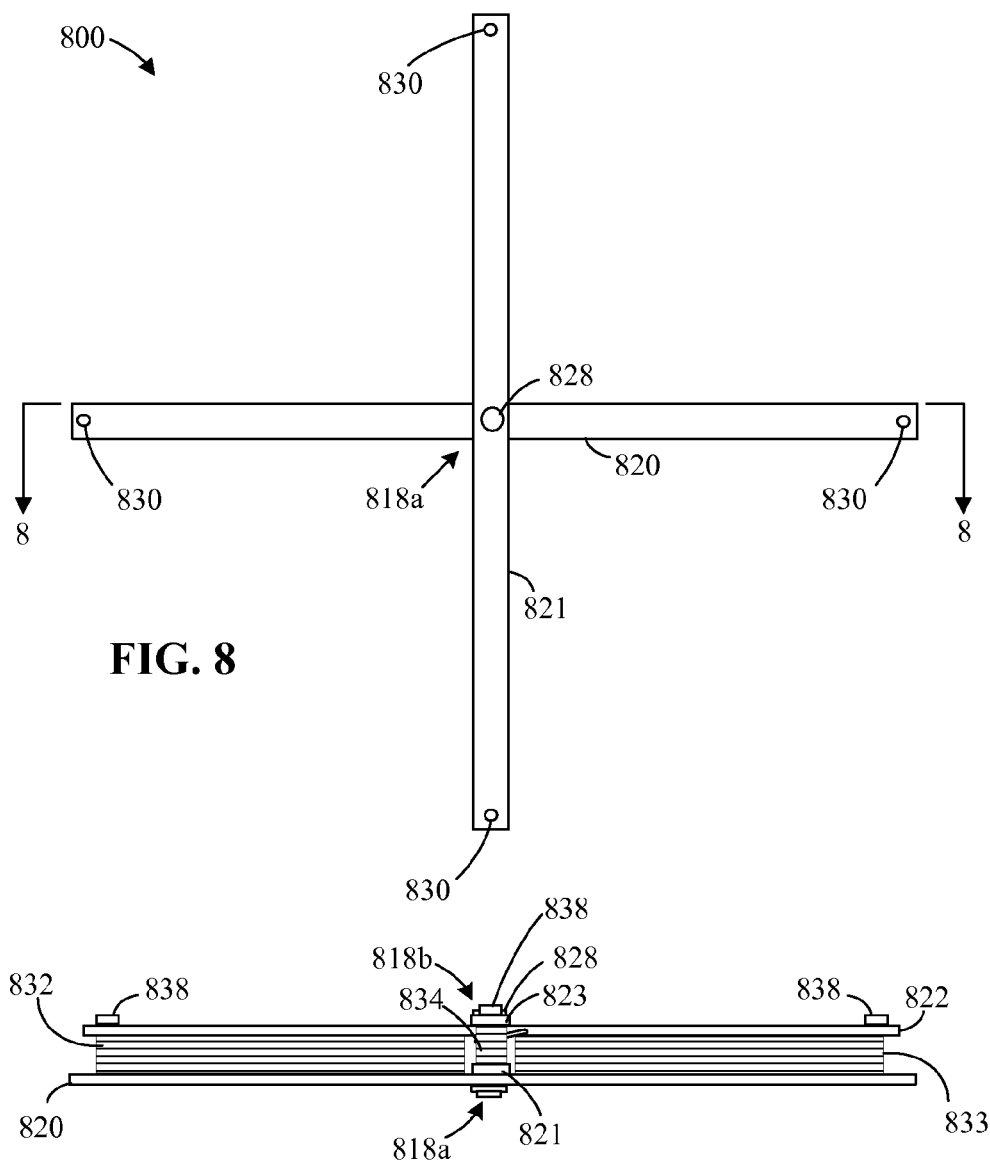
FIG. 8
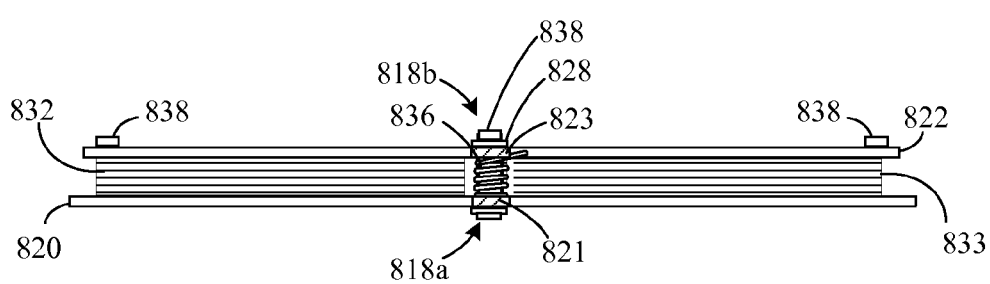
FIG. 9
FIG. 10

AIR VALVE FOR ELECTRONICS ENCLOSURES

BACKGROUND

This disclosure is in the field of cooling systems for electronic component enclosures, and, more specifically, the field of air valves for fans used with computer systems.

Electronic components, such as computer systems, are typically housed in a case, chassis, or other enclosure. In a data center, computer system cases may be stacked in a rack, e.g., a rack of servers. Multiple racks may be placed side by side in a row and a data center may have many rows of server racks. The electronic components of computer systems generate heat and system enclosures commonly include one or more cooling fans. Computer systems, such as servers, that generate significant heat may be equipped with two or more cooling fans. Enclosures with two or more fans may provide additional air flow and redundancy in the event one of the fans fails.

SUMMARY

Embodiments are directed to an air valve that includes a frame and various numbers of sheets of thin material. The frame may have a first elongated, outlet-side member and a first elongated inlet-side member. The first outlet-side member may have a first centrally located pivot point for attachment of a pin and a spring, and may be configured to be mounted in a fixed position. The first inlet-side member may have a second centrally located pivot point for receiving the pin. The inlet-side member may be rotatably coupled to the outlet-side member by the pin. In addition, the first inlet-side member may have a first end having a first magnetic component attached thereto.

In various embodiments, a first sheet of thin material may be provided. The first sheet of thin material may have top, bottom, first, and second side edges, and a plurality of folds perpendicular to the top and bottom side edges that divide the sheet into a plurality of sections. The material may be configurable between a folded position in which the sections are folded together and an expanded position in which the sections are unfolded. The first side edge of the sheet may be attached to the first outlet-side member and the second side edge of the sheet may be attached to the first inlet-side member. The air valve is in an open configuration when the material is in a folded position and a closed configuration when the material is in an expanded position.

An attraction between the first magnetic component and a second magnetic component in a fan blade translates rotational energy of the fan blade to the inlet-side member when the fan blade is rotating, causing the inlet-side member to rotate toward the open configuration. The spring causes the inlet-side member to rotate toward the closed position when the fan blade is not rotating.

BRIEF DESCRIPTION OF THE DRAWINGS

FIG. 8 is an outlet side view of a frame of an exemplary air valve in a closed position according to various embodiments.

FIG. 9 is a top down view of the frame of FIG. 8 according to various embodiments.

FIG. 10 is a cross-sectional view of the frame of FIG. 8 taken along the line 8-8 according to various embodiments.

Like reference numbers and designations in the various drawings indicate like elements. Dimensions of various aspects of the drawings are intended to be representative and may not be to scale.

DETAILED DESCRIPTION

Figure 1A:
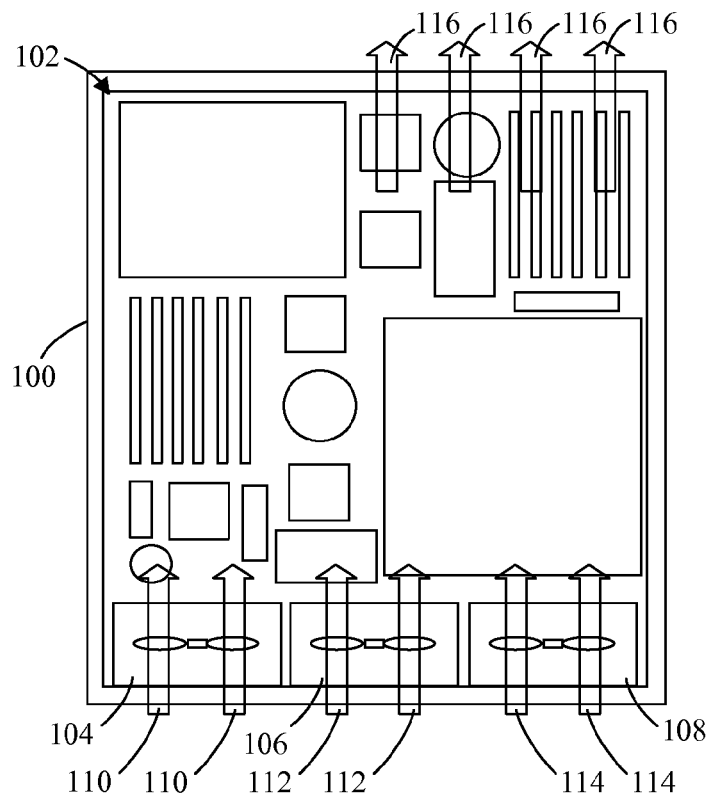
FIGS. 1A and 1B are plan views of an electronic component enclosure according to various embodiments.

An enclosure may include multiple fans to cool electronic components housed within the enclosure. The failure or replacement of a fan may lead to recirculation of heated air and reduced airflow over the internal electronic components, which may be undesirable. For example, electronic components operated outside of a specified thermal range may experience reduced performance or may fail.

Embodiments are directed to air valves for the fans of an electronic enclosure that may have two or more fans. According to various embodiments, an air valve may prevent air recirculation when the fan it is attached to stops rotating due to fan failure or servicing. In addition, the air valve may have a relatively low profile, such that the air valve requires only a modest amount of space on the interior of the electronic enclosure. As space within an electronic enclosure is typically at a premium, the low profile of the exemplary air valves may be an advantage. The air valve may provide relatively low impedance to airflow from the fan, which may be a further advantage.

According to various embodiments, an air valve may include a frame having two elongated members. A first elongated member may be fixed to the housing of a fan and a second elongated member is configured to rotate with respect to the first member about a pivot point. The pivot point may be located at central points of both members and may be centered on the fan housing to which the frame is attached. The second member may rotate about the pivot point. In response to rotation of the fan, the second member may rotate in a first direction. In response to the fan stopping, the second member may rotate in a second direction, which is opposite the first direction. The first direction of rotation coincides with the direction of rotation of the fan.

In some embodiments, the air valve may also include one or more sheets of thin accordion-folded material attached to the first and second members. In other embodiments, the material is comprised of multiple, interleaved triangular sheets of material. The accordion-folded material or triangular sheet materials are configurable between a folded position and an expanded position. When the second member rotates in the first direction in response to rotation of the fan, the material is placed in the folded position and assumes a profile similar in shape to the members. In the folded position, air from the fan is allowed to flow into the enclosure. When the second member rotates in the second direction in response to rotation of the fan stopping, the material is placed in the expanded position. In the expanded position, the material assumes a profile similar to a folding fan in its open position, preventing air flow between the interior and exterior of the enclosure through the fan opening. The second member may rotate in the first direction when the fan rotates as result of magnetic coupling between first magnetic elements on the second member and second magnetic elements on the blades (or the hub) of the fan. The second member may rotate in the second direction when rotation of the fan stops as a result of a rotational force from a spring located at the pivot point.

FIGS. 1A, 1B, 2A, and 2B illustrate an exemplary context for the embodiments described herein. FIGS. 1A, 1B, 2A, and 2B are plan views of an electronic component enclosure 100, such as a computer enclosure. Various electronic components 102 may be contained with the enclosure 100, e.g., power supplies, circuit boards, chips, dual in-line memory modules, or discrete components, such as capacitors. The enclosure 100 includes exemplary fans 104, 106, and 108. Directional arrows 110, 112, and 114 illustrate the flow of air from outside the enclosure to within the enclosure when all of the fans 104, 106, and 108 are operating. In other words, directional arrows 110, 112, and 114 illustrate airflows from inlet sides of the fans to outlet sides of the fans. Directional arrows 116 depict air exiting the enclosure 100.

Figure 1B:
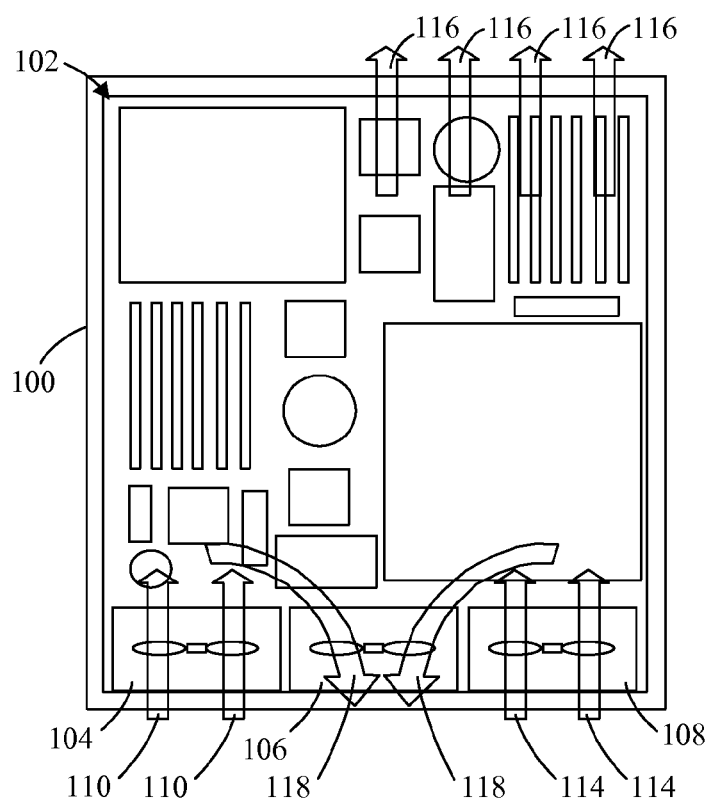

In FIG. 1A, all of the fans 104, 106, and 108 are operating. FIG. 1B depicts a situation in which the fan 106 is not operating. Directional arrows 118 illustrate how air may flow through the inoperative fan 106 and back outside the enclosure. This flow 118 through fan 106 may include air entering the enclosure from the fans 104 and 108 before this airflow has contacted the electronic components. The flow through fan 106 may also include heated air from within the enclosure, which flows out into the area from which operating fans 104 and 108 are drawing air. Accordingly, it may be seen that when the fan 106 is not operating, the airflow passing over the internal electronic components may be reduced and pre-heated air may be drawn into the enclosure along with the surrounding air. When the fan 106 is not operating, component temperatures may increase above temperatures experienced when the fan is operating.

Figure 2A:
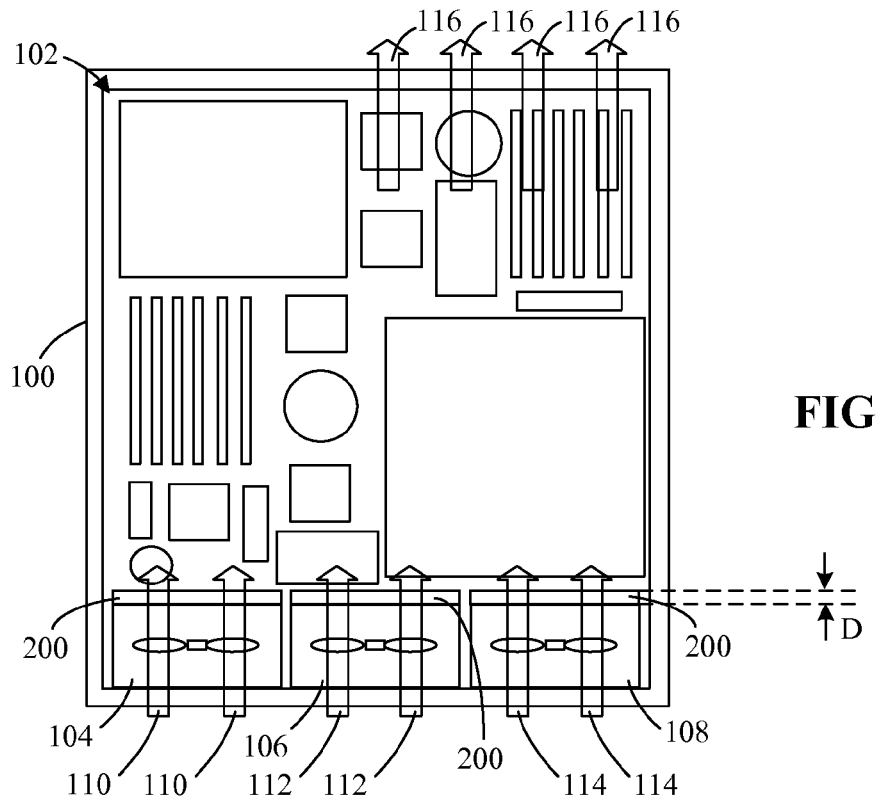
FIGS. 2A and 2B are plan views of an electronic component enclosure according to various embodiments.
Figure 2B:
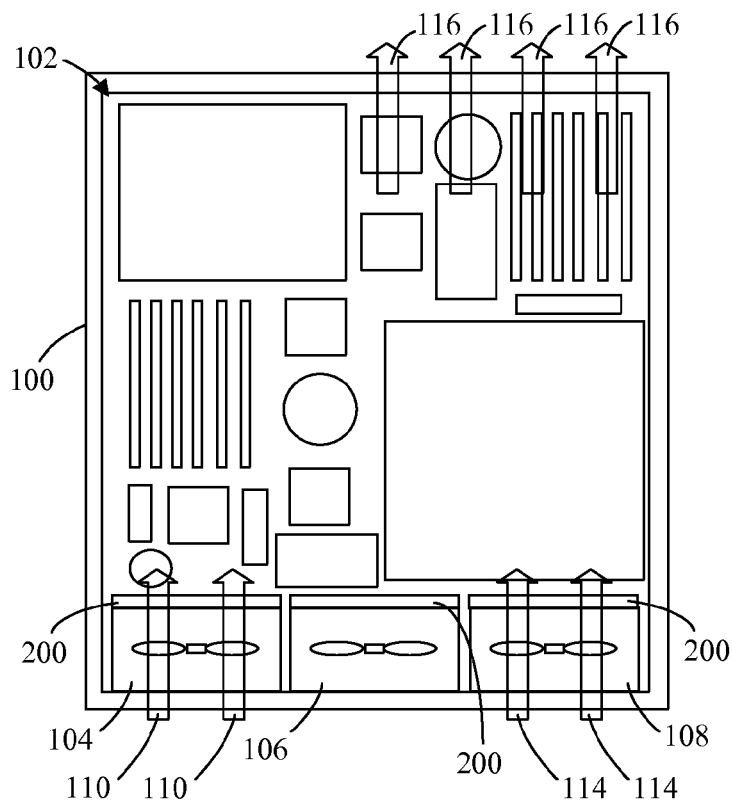

In FIGS. 2A and 2B, the fans of the enclosure 100 are equipped with air valves 200 according to various embodiments. The air valves 200 require a modest amount of space on the interior of the electronic enclosure. For example, in various embodiments, the air valves have a depth D of approximately 5 mm. In contrast, known passive air valves may require approximately 20-30 mm. of depth. In FIG. 2A, all of the fans 104, 106, and 108 are operating. In FIG. 2B, the fans 104 and 108 are operating, but the fan 106 is not operating. The air valve 200 on fan 106 prevents air from flowing through the inoperative fan 106 and back outside the enclosure. The air valve 200 may include a frame and one or more sheets of material.

Figure 3:
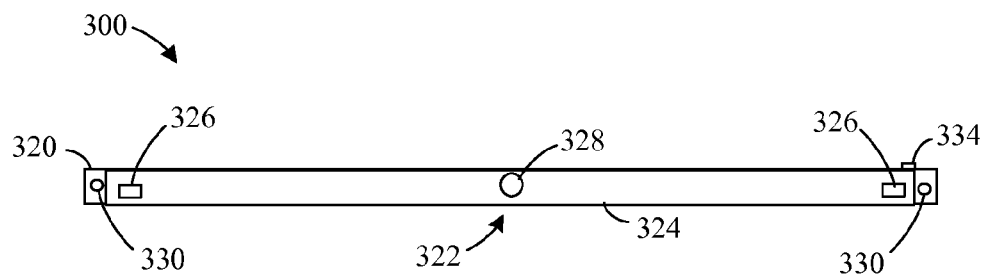
FIG. 3 is an inlet side view of a frame of an exemplary air valve in a closed position according to various embodiments.

FIG. 3 is an inlet side view of a frame 300 of an exemplary air valve, depicted in an open position, according to various embodiments. The frame 300 may include an elongated, outlet-side member 320 and an elongated inlet-side member 324. In FIG. 3, both the outlet-side member 320 and inlet-side member 324 are depicted in a horizontal position. The frame members 320 and 324 may be substantially the same length. However, in various embodiments, the outlet-side member 320 may be slightly longer than the inlet-side member 324. In addition, in various embodiments, one end of the inlet-side member 324 may be configured to contact a restraining piece 334 rather than continuing rotation, while another end may be configured to not contact the restraining piece 334. The outlet-side and inlet-side members 320, 324 may each have a pivot point 322 centrally located on the member, e.g., midway between the ends of the member. The outlet-side and inlet-side members 320, 324 may be joined by a pin, rod, or axle 328 at the pivot point. Magnetic elements or components 326 may be located at the ends of inlet-side member 324. In other embodiments, magnetic elements 326 may be located at suitable other locations on inlet-side member 324, e.g., close to the pivot point. Attachment points 330 may be located at the ends of the outlet-side member 320. The attachment points 330 allow the outlet-side member 320 to be mounted in a fixed position.

Figure 4:
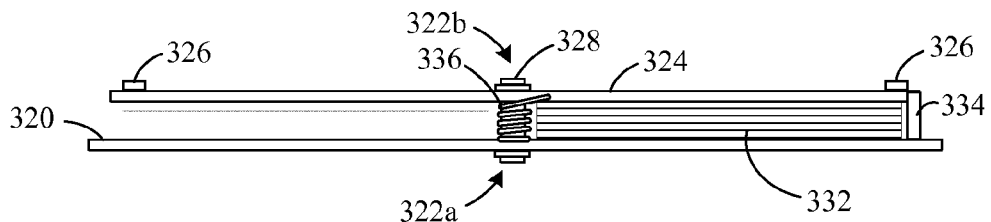
FIG. 4 is a top down view of the frame of FIG. 3 according to various embodiments.

FIG. 4 is a top down view of the frame 300. The outlet-side member 320 may have a first centrally located pivot point 322a for attachment of the pin 328. The inlet-side member 324 may have a second centrally located pivot point 322b for receiving the pin 328. The inlet-side member 324 may be rotatably coupled to the outlet-side member 328 by the pin 328. In various embodiments, a spring 336 may be located at the pivot point 322. As shown in FIG. 4, the spring 336 may be attached to or be contacting the pin 328, outlet-side member 320, and inlet-side member 324. The spring 336 may cause the inlet-side member 334 to rotate about the pivot point 328 toward a closed open position when the fan is not rotating.

A sheet of thin material 332 may be attached to the frame 300. In various embodiments, the sheet may be polymer, such as biaxially-oriented polyethylene terephthalate, e.g., Mylar. In FIGS. 3 and 4, the sheet 332 is in a folded position. In the shown embodiment, the sheet 332 may have top, bottom, first, and second side edges, and a plurality of folds perpendicular to the top and bottom side edges that divide the sheet into a plurality of sections. The material 332 is configurable between a folded position in which the sections are folded together and an expanded position in which the sections are unfolded. In other words, the material is collapsible. In the shown embodiment, the sheet 332 is folded in a manner similar to an accordion. The first side edge of the sheet may be attached to the outlet-side member 320 and the second side edge of the sheet may be attached to the inlet-side member 324. When the material is in a folded position, as shown in FIGS. 3, 4 and 6, the air valve is in an open configuration.

Figure 5:
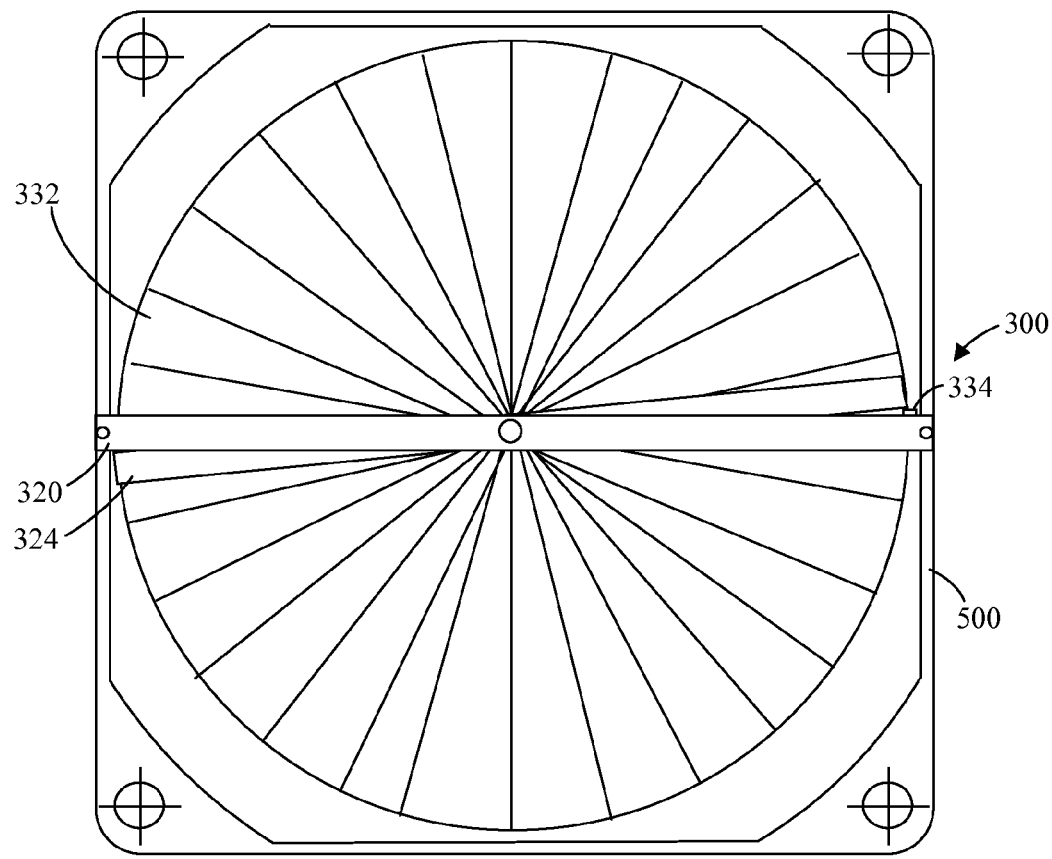
FIG. 5 is an outlet side view of the air valve of FIG. 3, attached to a fan housing and in a closed configuration, according to various embodiments.

FIG. 5 is an outlet side view of the frame 300 attached to a fan housing 500. In FIG. 5, the material 332 is in an expanded position and the air valve is in a closed configuration that impedes or blocks air flow. FIG. 6 also shows the frame 300 attached to the fan housing 500. In FIG. 6, the material 332 is in the folded position and the air valve is in an open configuration. FIG. 7 shows the material 332 in an intermediate state between the folded and expanded positions, and the air valve in an intermediate state between an open and closed configuration.

According to various embodiments, an attraction between first magnetic components 326 on the inlet-side member 324 and second magnetic components 602 on fan blades 604 translates rotational energy of the fan blade to the inlet-side member 324 when the fan blade is rotating, causing the inlet-side member 324 to rotate toward the open configuration. The moment exerted on the inlet-side member 324 via the coupling force is greater than the closing force imparted by the spring 336, causing the movable member to rotate into the open state and stop. In some embodiments, a small restraining piece 334 may be provided to assure that the movable member stops rather than continuing rotation. This motion causes the material 332 to retract and be housed between the outlet-side and inlet-side members 320, 324, opening the bulkhead and minimizing air flow impedance. This state may be maintained so long as the fan rotor is spinning. Other embodiments described herein may operate according to these principles.

Figure 6:
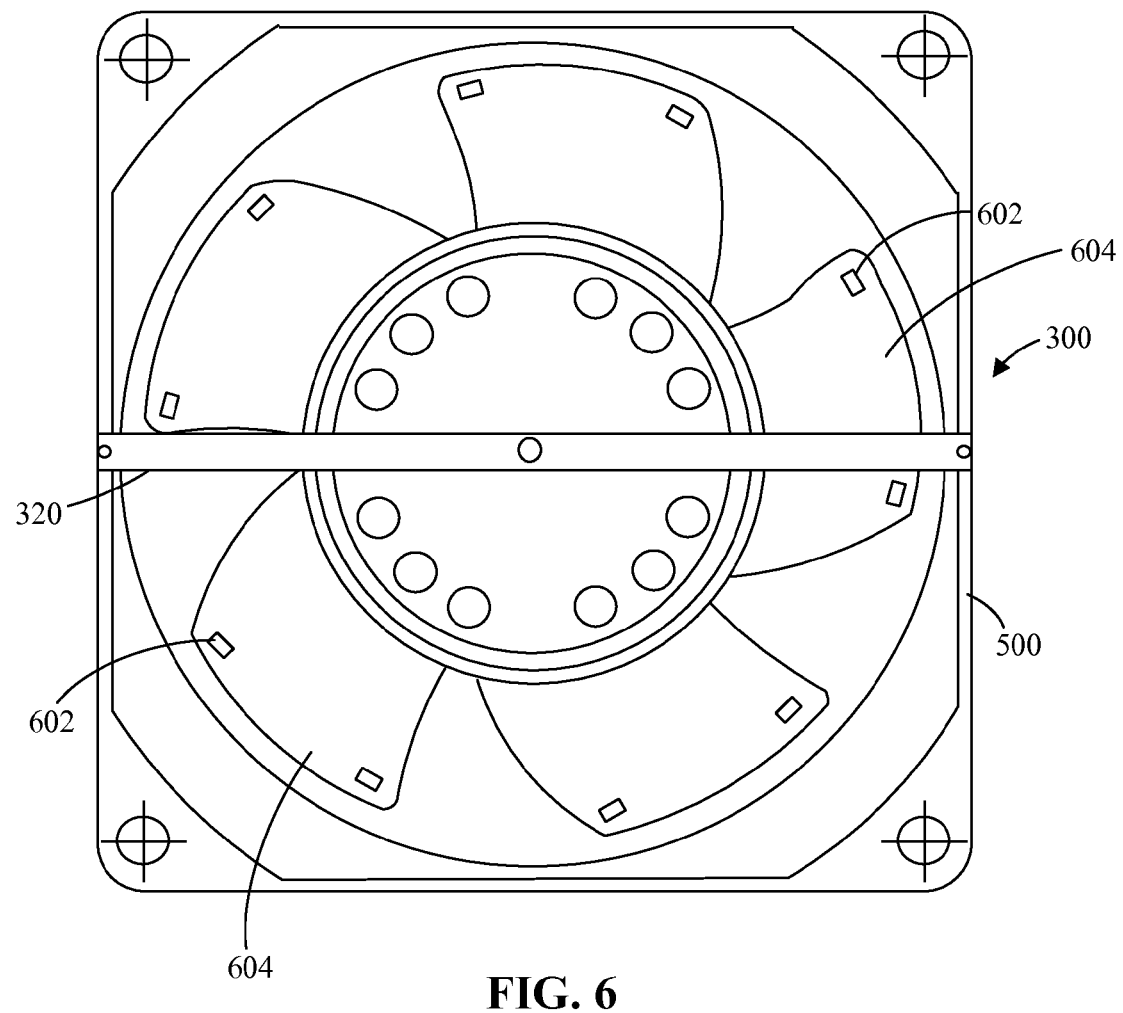
FIG. 6 is an outlet side view of the air valve of FIG. 3, attached to a fan housing and in an open configuration, according to various embodiments.
Figure 7:
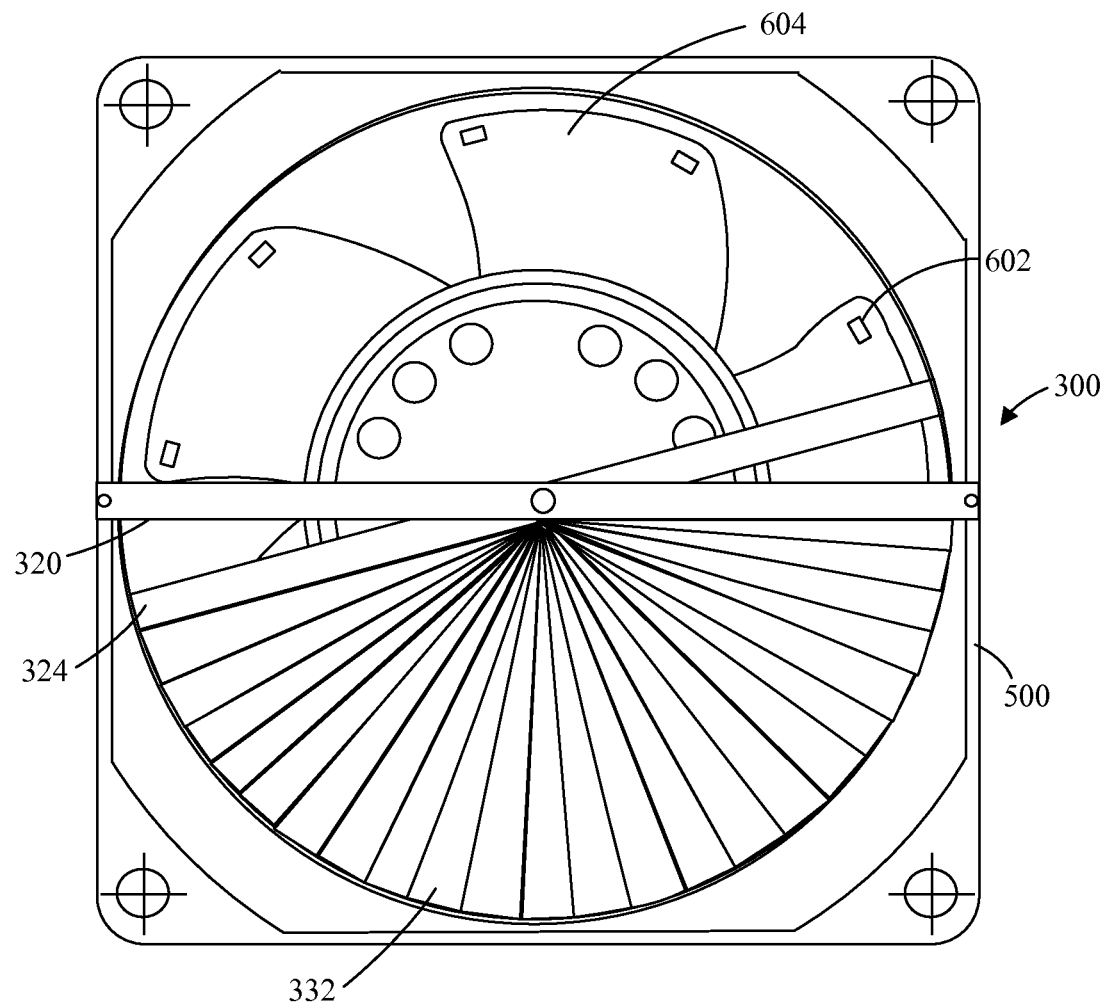
FIG. 7 is an outlet side view of the air valve of FIG. 3, attached to a fan housing and in an intermediate state between an open and closed configuration.
Figure 11:
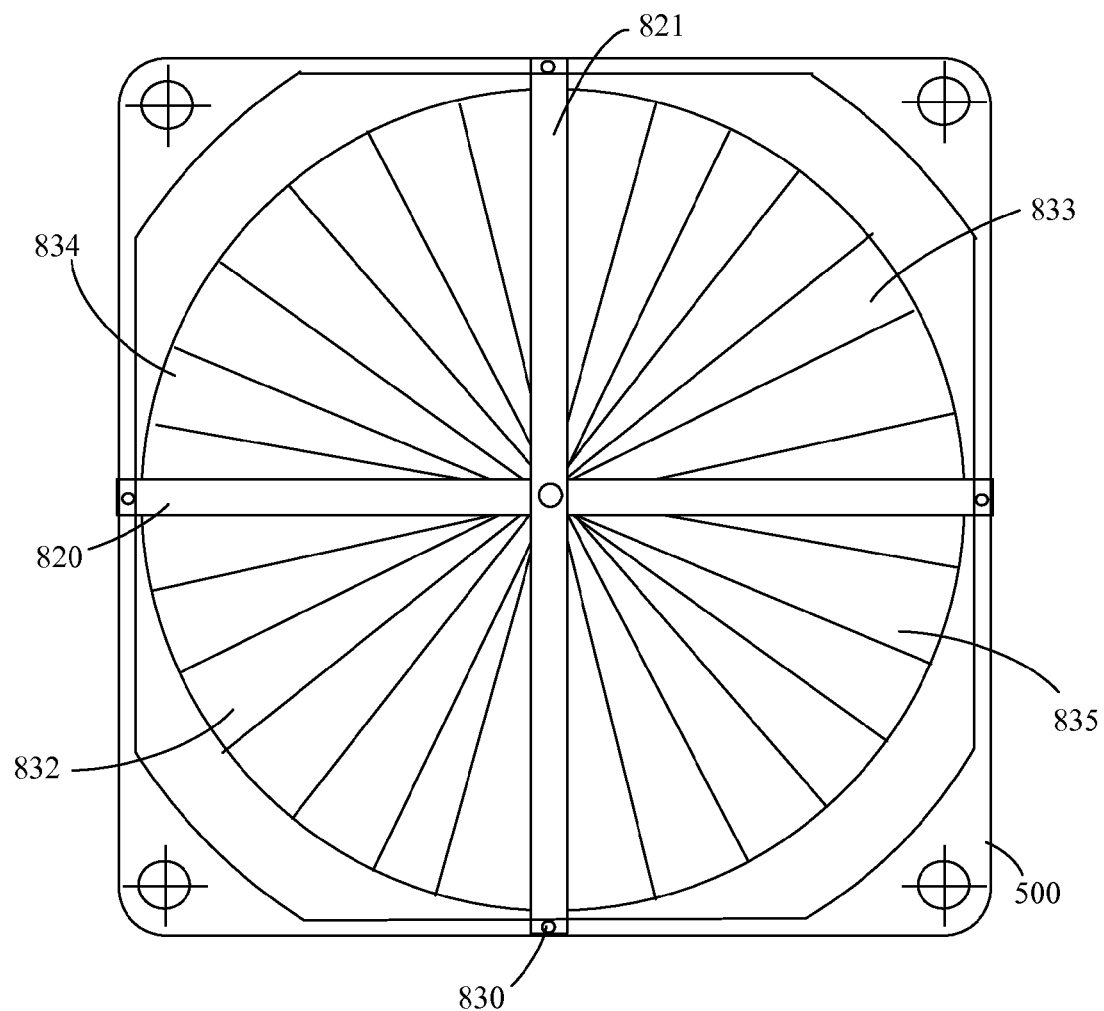
FIG. 11 is an outlet side view of the air valve of FIG. 8, attached to a fan housing and in a closed configuration, according to various embodiments.
Figure 12:
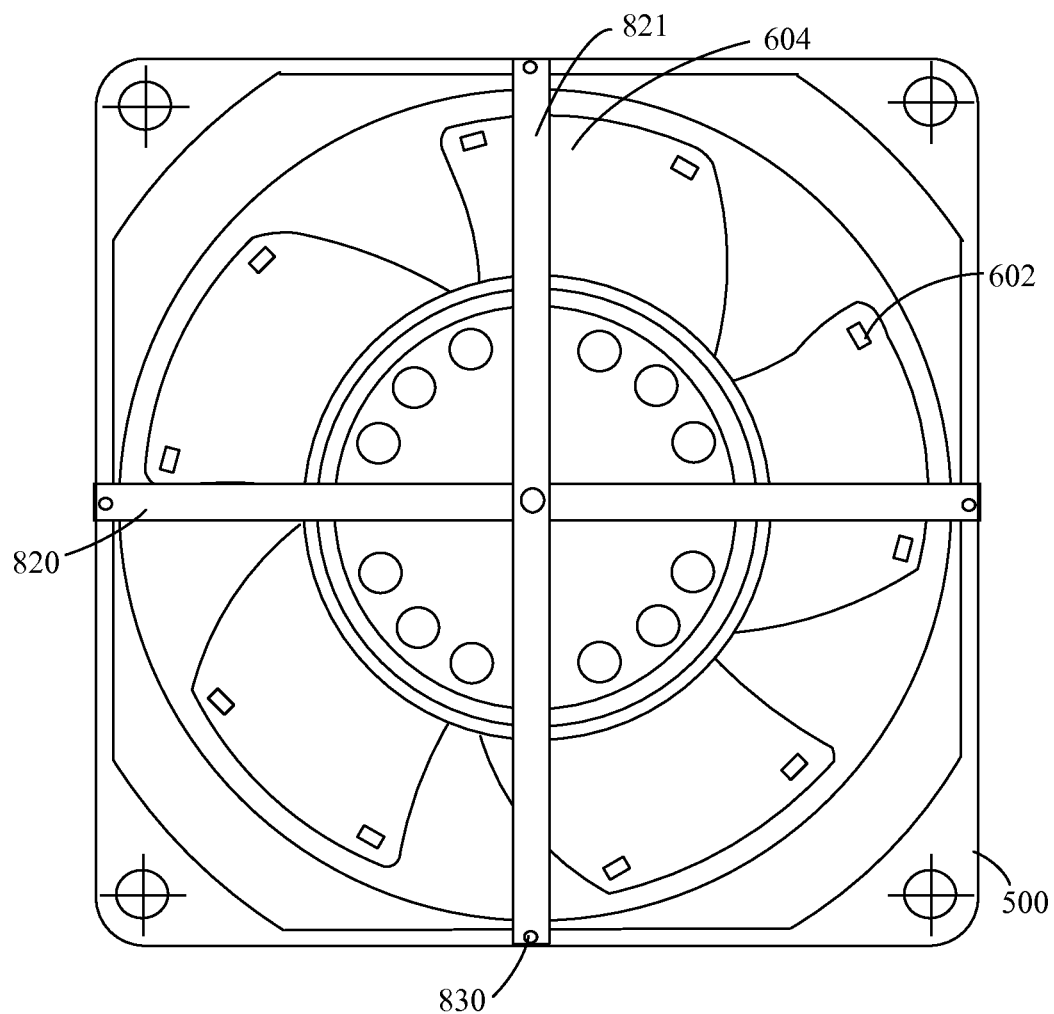
FIG. 12 is an outlet side view of the air valve of FIG. 8, attached to a fan housing and in an open configuration, according to various embodiments.
Figure 13:
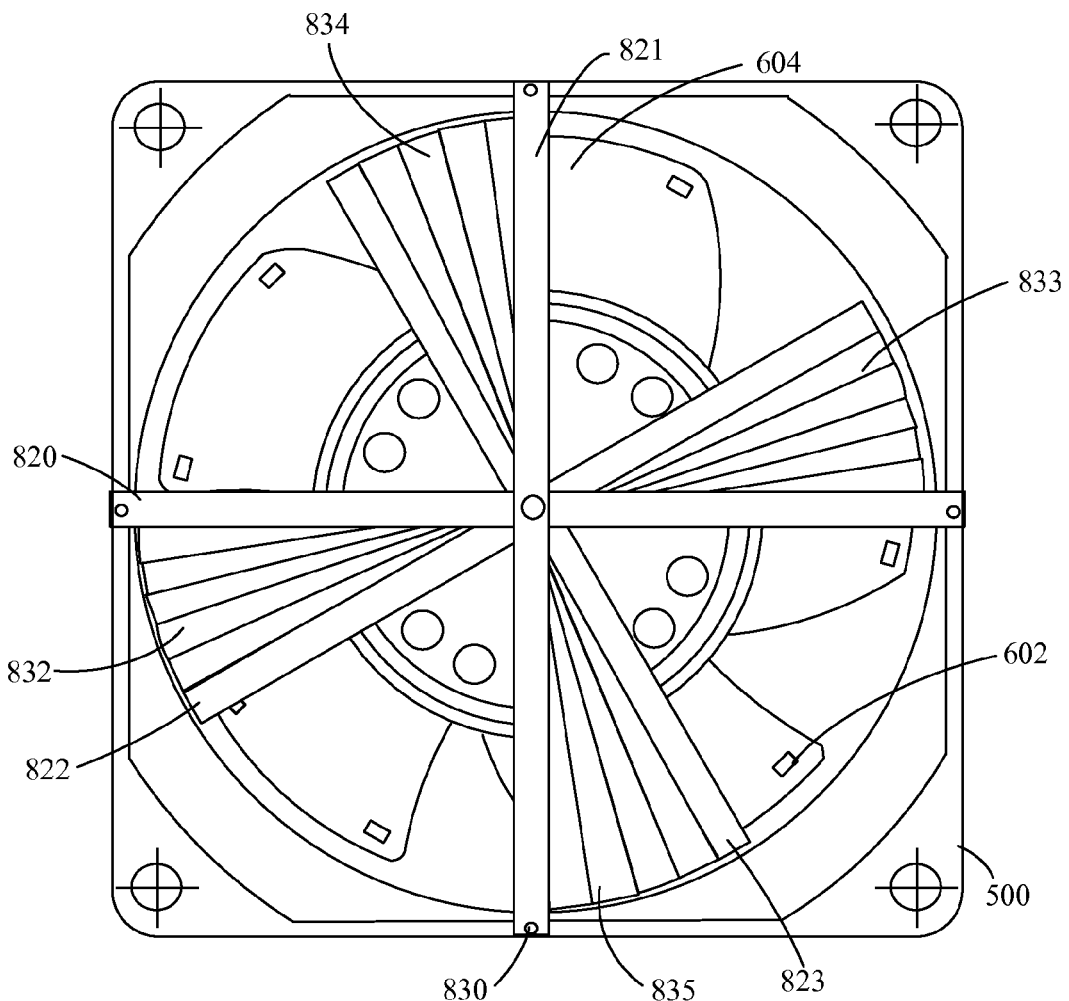
FIG. 13 is an outlet side view of the air valve of FIG. 8, attached to a fan housing and in an intermediate state between an open and closed configuration.

As shown in FIGS. 5-7, in some embodiments, the inlet-side member 324 may rotate approximately 360 degrees and the material 332 material may assume a circular profile in an expanded position. In various embodiments, an inlet-side member (or members) may rotate 180 degrees, and two pieces of material 332 may be provided, each assuming a semi-circular profile in an expanded position. In various embodiments, an inlet-side member (or members) may rotate 90 degrees, and four pieces of material 332 may be provided, each assuming quarter-circular profile in an expanded position. In various embodiments, inlet-side members may be provided that rotate any other suitable number of degrees, and the material 332 may assume semi-circular, quarter-circular, or any other suitable profile in an expanded position. One alternative embodiment of an air valve that rotates 90 degrees is next described with reference to FIGS. 8-13.

FIG. 8 is an outlet side view of a frame 800 of an exemplary air valve, depicted in a closed position, according to various embodiments. As shown in FIG. 8, the frame 800 may include a pair of elongated, outlet-side members 820 and 821. The outlet-side member 820 is depicted in a horizontal orientation and the outlet-side member 821 is depicted in a vertical orientation. The members 820 and 821 may either be integrally formed or separate members rigidly joined together by any suitable means. The members 820 and 821 may be substantially the same length with at an approximate 90 degree angle between them. A pivot point 818a may be centrally located on the members 820 and 821, e.g., midway between the ends of the members. The members 820 and 821 may receive a pin, rod, or axle 828 at the pivot point 818a. Attachment points 830 may be located at the ends of the outlet-side members 820 and 821. The attachment points 830 allow the members 820 and 821 to be mounted in a fixed position.

The frame 800 may include a pair of elongated, inlet-side members 822 and 823 in addition to the outlet-side members 820 and 821. The inlet-side members 822 and 823 may not be seen in FIG. 8, as they sit directly behind the outlet-side members 820 and 821 (when viewed from the outlet side) when the air valve is in an open configuration or position. However, they may be seen in FIGS. 9, 10, and 13.

FIG. 9 is a top side view of the frame 800 of FIG. 8 according to various embodiments. FIG. 10 is a cross-sectional view of the frame 800 taken along the line 8-8. Inlet-side members 822 and 823 are disposed adjacent to the outlet-side members 820 and 821. The inlet-side members 822, 823 and outlet-side members 820, 821 may have substantially the same dimensions, although the inlet-side members 822, 823 may be slightly shorter than the outlet-side members 820, 821 in some embodiments. In FIGS. 9 and 10, the inlet-side member 822 is depicted in a horizontal orientation and the inlet-side member 823 is depicted in a vertical orientation. The members 822 and 823 may have an angle of approximately 90 degrees between them. The members 822 and 823 may either be integrally formed or separate members rigidly joined together by any suitable means. Magnetic elements or components 838 may be located at the ends of the inlet-side members 822, 823. In other embodiments, magnetic elements 838 may be located at suitable other locations on inlet-side members 822, 823, e.g., close to the pivot point.

FIG. 10 is a cross-sectional view of the frame 800 taken along the line 8-8. The view of FIG. 10 depicts a top-side view similar to the view of FIG. 9 except that the top portions of the outlet-side member 821 and inlet-side member 823, and the collapsible structure 834 disposed therebetween have been removed to reveal a rotation-generating hub element 836. In some embodiments, the rotation-generating hub element 836 may be a coil spring wound around an axial member.

The outlet-side members 820, 821 may have a first centrally located pivot point 818a for attachment of the pin 828. The inlet-side members 822, 823 may have a second centrally located pivot point 818b for receiving the pin 828. The inlet-side members 822, 823 may be rotatably coupled to the outlet-side members 820, 821 by the pin 828. In various embodiments, a spring 836 may be located at the pivot point 822. As shown in FIG. 10, the spring 836 may be attached to or be contacting the pin 828, outlet-side members 820, 821, and inlet-side members 822, 823. The spring 836 may cause the inlet-side members 822, 823 to rotate about the pivot point 328 toward a closed position when the fan is not rotating.

An attraction between first magnetic components 838 on the inlet-side members 822, 823 and second magnetic components 602 on fan blades 604 translates rotational energy of the fan blade to the inlet-side members 822, 823 when the fan blade is rotating, causing the inlet-side members 822, 823 to rotate toward the open configuration. The moment exerted on the inlet-side members 822, 823 via the coupling force is greater than the closing force imparted by the spring 336, causing the movable members to rotate into the open state and stop against a small restraining piece 334 rather than continuing rotation. Rotation beyond the open position may be prevented by a stop or other restraining piece (not shown).

Four sheets of thin material 832, 833, 834, and 835 may be attached to the frame 800. In FIGS. 9, 8, 10, and 12, the sheets 832, 833, 834 are shown in a folded position (sheet 835, also folded, is obscured by the sheet 834 and the spring 836 and pin 828). In various embodiments, the sheets may be polymer, such as biaxially-oriented polyethylene terephthalate, e.g., Mylar. Each sheet 832, 833, 834, and 835 may have top, bottom, first, and second side edges, and a plurality of folds perpendicular to the top and bottom side edges that divide the sheet into a plurality of sections. Each sheet of material 832, 833, 834, and 835 is configurable between a folded position in which the sections are folded together and an expanded position in which the sections are unfolded. First side edges of the sheets 832 and 833 may be attached to the outlet-side member 820 and second side edges of the sheets 832, 833 may be attached to the inlet-side member 822. First side edges of the sheets 834 and 835 may be attached to the outlet-side member 821 and second side edges of the sheets 834, 835 may be attached to the inlet-side member 823. When the material is in a folded position, the air valve is in an open configuration.

Figure 14A:
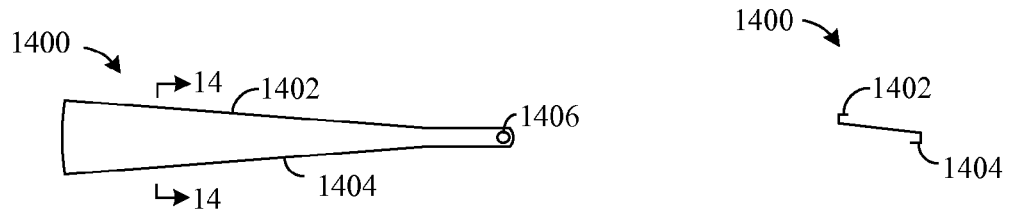
FIGS. 14A and 14B respectively show plan and side views of an exemplary solid piece according to various embodiments.
Figure 14B:
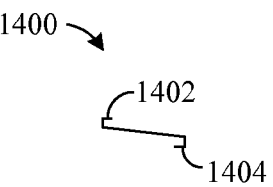

As described above, the material 332, 832, 833, 834, and 835 may be made of an accordion folded sheet. In alternative embodiments, the material 332, 832, 833, 834, and 835 may be made of a plurality of interleaved solid pieces or sections that assume a fan-like structure in an expanded configuration. The interleaved solid pieces or sections may be a polymer, such as biaxially-oriented polyethylene terephthalate, e.g., Mylar. FIG. 14A shows plan view of one exemplary solid section 1400. FIG. 14B shows cross-sectional view of the piece 1400, taken at line 14-14 of FIG. 14A. As may be seen in FIG. 14A, the section 1400 may have a triangular shape similar to the leaves of a folding fan and may include an opening 1406 to receive a pin or axle. As may be seen in FIG. 14B, the piece 1400 may have flanges, hook flanges, or rims at edges 1402, 1404 that allow adjacent pieces to stop and interlock with an adjacent section when the plurality of pieces are in an expanded position and the air valve is closed. The plurality of sections 1400 may be folded together and positioned in a position between frame members when the air valve is open.

While the frame members have been shown as straight elongated members, in various alternative embodiments, a frame member may be formed in a curved or other suitable shape. In addition, while second magnetic components 602 on fan blades have been depicted near the outer ends of the fan blades, in alternative embodiments, the second magnetic components 602 may be located near the center or rotation, either on the fan blades or fan hub.

Embodiments have been described with respect to a passive implementation. In other words, a coil spring in a hub puts a rotatable member into a closed state when a fan rotor is not turning, and a coupling between magnets embedded in the rotatable member and magnets in the blades of the fan rotate puts the rotatable member into an open state when the fan rotor is turning. In alternative embodiments, other passive means of coupling are contemplated.

In addition, in various alternative embodiments, active implementations are contemplated. As one example, the spring-and-magnet system may be replaced with an electric actuator in the hub. The computer system may include hardware, software, or a combination of hardware and software that detects when a fan fails, is being serviced, or in a similar inoperative state, and in response to detecting the inoperative state causes the electric actuator in the hub to close or open the device as required.

A variety of examples are presented in this Detailed Description. These examples may be referred to as exemplary. Note that the term "exemplary," as used in this Detailed Description, simply means an example, instance, or illustration. This term is not used to mean that a particular example is superior, commendable, or otherwise deserving of imitation over other examples.

While the foregoing is directed to exemplary embodiments, other and further embodiments of the invention may be devised without departing from the basic scope thereof, and the scope thereof is determined by the claims that follow.

What is claimed is:

1. An air valve, comprising:
a frame having:
a first elongated, outlet-side member having a first centrally located pivot point for attachment of a pin and a spring, and configured to be mounted in a fixed position, and
a first elongated inlet-side member having a second centrally located pivot point for receiving the pin, and a first end having a first magnetic component attached thereto, the inlet-side member being rotatably coupled to the outlet-side member by the pin,
a first sheet of thin material having top, bottom, first, and second side edges, and a plurality of folds perpendicular to the top and bottom side edges that divide the sheet into a plurality of sections, wherein the material is configurable between a folded position in which the sections are folded together and an expanded position in which the sections are unfolded, the first side edge of the sheet being attached to the first elongated outlet-side member and the second side edge of the sheet being attached to the first elongated inlet-side member;
wherein the air valve is in an open configuration when the first sheet of thin material is in a folded position and a closed configuration when the material is in an expanded position; and
wherein an attraction between the first magnetic component and a second magnetic component in a fan blade translates rotational energy of the fan blade to the first elongated inlet-side member when the fan blade is rotating, causing the first elongated inlet-side member to rotate toward the open configuration, and the spring causes the first elongated inlet-side member to rotate toward the closed position when the fan blade is not rotating.

2. The air valve of claim 1, wherein the frame further comprises a frame having:
a second elongated, outlet-side member attached to the first elongated outlet-side member, and
a second elongated, inlet-side member attached to the first elongated inlet-side member; and
wherein the air valve further comprises: second, third, and fourth sheets of thin material.

3. The air valve of claim 1, further comprising a first fan, wherein the air valve is attached to the fan.

4. The air valve of claim 1, further comprising an enclosure having first and second fans, wherein the air valve is attached to the first fan.

5. The air valve of claim 1, wherein the material is biaxially-oriented polyethylene terephthalate.

6. An air valve, comprising:
a frame having:
a first elongated outlet-side member having a first centrally located pivot point for attachment of an axle and a spring, and configured to be mounted in a fixed position, and
a first elongated inlet-side member having a second centrally located pivot point for receiving the axle, and a first end having a first magnetic component attached thereto, the first elongated inlet-side member being rotatably coupled to the first elongated outlet-side member by the axle,
a plurality of interleaved sections, each section constructed of a thin material having a triangular shape and a hook flange at opposite edges to interlock with an adjacent section, wherein the thin material is configurable between a folded position in which the sections are folded together and an expanded position in which the sections are unfolded,
wherein the air valve is in an open configuration when the material is in the folded position and a closed configuration when the material is in the expanded position; and wherein an attraction between the first magnetic component and a second magnetic component in a fan blade translates rotational energy of the fan blade to the first elongated inlet-side member when the fan blade is rotating, causing the first elongated inlet-side member to rotate toward the open configuration, and the spring causes the first elongated inlet-side member to rotate toward the closed configuration when the fan blade is not rotating.

7. The air valve of claim 6, wherein the frame further comprises a frame having:
a second elongated, outlet-side member attached to the first elongated outlet-side member, and
a second elongated, inlet-side member attached to the first elongated inlet-side member; and
wherein the air valve further comprises: second, third, and fourth sheets of thin material.

8. The air valve of claim 6, further comprising a first fan, wherein the air valve is attached to the fan.

9. The air valve of claim 6, further comprising an enclosure having first and second fans, wherein the air valve is attached to the first fan.

10. The air valve of claim 6, wherein the thin material is biaxially-oriented polyethylene terephthalate.

* * * * *